United States Patent [19]

Koval

[11] 4,360,393
[45] Nov. 23, 1982

[54] VAPOR DEPOSITION OF $H_3PO_4$ AND FORMATION OF THIN PHOSPHORUS LAYER ON SILICON SUBSTRATES

[75] Inventor: Timothy D. Koval, Gaithersburg, Md.

[73] Assignee: Solarex Corporation, Rockville, Md.

[21] Appl. No.: 217,742

[22] Filed: Dec. 18, 1980

[51] Int. Cl.$^3$ ................................................ C30B 1/02
[52] U.S. Cl. .................................. 148/171; 156/605; 156/603; 156/DIG. 64
[58] Field of Search ....... 156/605, 606, 610, DIG. 73, 156/DIG. 64, 603; 427/85; 428/446, 538; 148/175, 1.5, 171

[56]  References Cited

U.S. PATENT DOCUMENTS 3,173,802  3/1965  Patel et al. .......................... 156/610
4,206,026  6/1980  Briska et al. .......................... 427/85

Primary Examiner—Hiram H. Bernstein
Attorney, Agent, or Firm—Watson, Cole, Grindle & Watson

[57]  ABSTRACT

Provision for a source of phosphorus dopant on a silicon wafer, for the subsequent formation of an electrical p-n junction, by the vapor deposition, at atmospheric pressure, of phosphoric acid to form an essentially continuous film on a silicon wafer, said wafer being at room temperature, and the firing of said film to form a phosphorus oxide-silicate-glass layer which will not interfere with any antireflective layer deposited thereon.

10 Claims, No Drawings

VAPOR DEPOSITION OF $H_3PO_4$ AND FORMATION OF THIN PHOSPHORUS LAYER ON SILICON SUBSTRATES

This invention relates to a method of deposition, on a silicon wafer, an essentially continuous film of phosphoric acid which by subsequent treatment forms an electrical p-n junction.

Microelectronic devices, such as solar cells, may be formed from crystalline silicon wafers which have been doped with one conductivity type of impurity, causing the silicon wafer to adopt a specific polarity. To obtain an N-type polarity a dopant such as a phosphorus derivative is frequently utilized. Boron is a commonly used dopant to form a P-type polarity. For a junction between opposite types, one of the two configurations is commonly an N-type layer on a P-type substrate. To form such a layer, a source of phosphorus is deposited on the substrate and the deposited material is, subsequently or simultaneously with the deposition, heat treated.

The introduction of a phosphorus source has been accomplished in the prior art by several different means including spraying, dipping, and spin-on of a phosphorus derivative, or the use of a gaseous form of phosphorus, such as phosphine or phosphorus oxychloride, in an inert gas. The substrate with its phosphorus layer is then heated to convert the phosphorus to its oxide and/or diffuse the material into the substrate.

The prior art methods have disadvantages which are avoided by the method of the present invention, the main disadvantage being the relatively high thickness of the resultant oxide layer. In many cases the thick phosphoric oxide/silicate layer that is formed interferes with the deposition or the optical coupling of an antireflective coating, and some of the phosphorus derivative layer must be removed prior to the application of a coating.

In the method of this invention phosphoric acid is vaporized and the vapors condensed onto a silicon wafer or a P-type silicon substrate maintained at a temperature below the boiling point of the phosphoric acid source, and preferably at or near room temperature. The silicon substrate is then heated in the approximate range of 800 to 900° C. to convert the phosphoric acid to its oxide along with silicon dioxide and thereby provide a solid layer from which phosphorus is diffused into the silicon substrate.

Phosphoric acid maybe vaporized by merely heating the source of phosphoric acid to its boiling point. Commercial (85%) phosphoric acid has a boiling point of about 158° C. and 100% phosphoric acid boils at about 261° C. In order to ensure complete vaporization of the phosphoric acid it is preferred to utilize temperatures higher than the boiling temperature. A convenient method to ensure complete vaporization of the phosphoric acid is to spray the phosphoric acid, with or without an inert gas carrier, through a heated zone maintained in the approximate range of 400° C. to 800° C. where the sprayed phosphoric acid rapidly vaporizes. In order to further ensure rapid vaporization it is preferred that the sprayed phosphoric acid consist of minute droplets. Commercial spraying equipment, such as atomizers, are available for this purpose.

For convenience, and as a low cost source of phosphoric acid, commercial 85% phosphoric acid is utilized. The water present in the acid does not interfere with the process since it is theorized that in the heat treatment of the silicon substrate with its film of phosphoric acid, the acid dehydrates to form water as a byproduct.

If an inert gas is utilized it is preferably selected from the group consisting of nitrogen, argon, helium or neon, with argon and helium being preferred.

As a specific example of the practice of my invention, commercial phosphoric acid is sprayed, by an atomizer (airbrush) with an inert gas propellant and passed through a stainless steel tube heated to a range of about 600° C. to about 800° C., vaporizing the acid. The heated phosphoric acid vapor is then passed over a circular silicon wafer, about 3 inches in diameter, maintained at approximately room temperature, for approximately one to two minutes during which time the phosphoric acid condenses onto the silicon wafer. The silicon wafer is then heated to the range of approximately 800° C. to 900° C. for about 10 to about 14 minutes, in which the phosphorus oxide-silicate-glass layer is formed. As a result of this treatment the resultant derivative layer is of a thickness of about 90° A to about 200° A. This thickness is approximately one order of magnitude thinner than layers obtained by prior art methods and does not interfere with subsequent coatings, such as antireflective coatings.

The condensed phosphoric acid on the silicon substrate is obtained as an essentially continuous film. This process is also operable when the condensed vapor forms a closely proximate discontinuous film, semi-continuous film or the preferred essentially continuous film.

This process is also operable without the use of an inert gas by spraying the phosphoric acid directly into the heated tube. The vapors formed in this tube are propelled forward out of the tube onto the silicon wafer.

Although in the specific example a 3 inch diameter circular silicon wafer was utilized, other configurations and dimensions can be used. The time sequence of both the condensation step and the conversion step will have to be varied to obtain a phosphorus derivative layer in the desired thickness, that is, in the range of about 90° A to about 200° A which does not interfere with any antireflective coating, such as $Ta_2O_5$, which may thereafter be deposited on the cell.

A condensation time, that is, the time the silicon wafer is subjected to vaporized phosphoric acid, of about 45 seconds to about 2 minutes is sufficient to obtain the desired film coverage. Longer time periods may result in a thicker phosphorus derivative layer on heat treatment.

The condensation process, with or without the inert gas carrier, is preferably conducted at about atmospheric pressure. No advantages are obtained by the use of higher pressures that would warrant their use.

Heating of the silicon wafer should be maintained at the elevated temperatures for a period of about 5 minutes to about 20 minutes to convert the phosphoric acid to its oxide, obtain diffusion and develop a glass layer.

This process can be utilized as a batch process, that is, as individual steps utilizing different or the same chamber and stopping one step before initiating the next step, or as a continuous process where the silicon substrate passes automatically from the condensation step to the heating step without interrupting the condensation step for subsequent silicon wafers. In the continuous process the speed of movement through a chamber, maintained at the required temperature range, can be correlated with the time requirement for each step.

While the present invention has been described with respect to a preferred mode thereof, it will be apparent that numerous alterations and modifications will be apparent to those skilled in the art without departing from the spirit of the invention. As to all such obvious alterations and modifications, it is desired that they be included within the purview of my invention, which is to be limited only by the scope, including equivalents, of the following appended claims.

I claim:

1. A method of forming a phosphorus/silicon glass layer on the surface of a silicon substrate, comprising
   (a) providing liquid phosphoric acid,
   (b) vaporizing said phosphoric acid to a gasous form,
   (c) condensing said gaseous phosphoric acid on the surface of said silicon substrate to form a film on said substrate, and
   (d) heating said substrate and said film to form a phosphorus/silicon glass layer on said substrate and a P-N junction in said substrate.

2. A method as claimed in claim 1, in which said gaseous phosphoric acid is formed by spraying said liquid phosphoric acid through a tube heated to a temperature in the range of about 400° C. to 800° C.

3. A method as claimed in claim 2, in which said gaseous phosphoric acid is carried by an inert gas.

4. A method as claimed in claim 3, in which said inert gas is selected from the group consisting of nitrogen, argon, helium and neon.

5. A method as claimed in claim 1, in which said gaseous phosphoric acid is maintained at about atmospheric pressure during condensation on said substrate.

6. A method as claimed in claim 1, in which said substrate and said film are heated to a temperature in the range of about 800° C. to about 900° C. to form said glass layer.

7. A method as claimed in claim 1, in which said phosphorus/silicon glass layer has a thickness of about 90° A to 200° A.

8. A method as claimed in claim 1, in which said liquid phosphoric acid is vaporized by spraying it with an atomizer.

9. A method as claimed in claim 8, in which said liquid phosphoric acid is sprayed through a zone heated to about 400° to 800° C.

10. A method as claimed in claim 1, in which said silicon substrate is subjected to gaseous phosphoric acid for about 45 seconds to 2 minutes.

* * * * *